(12) United States Patent  (10) Patent No.: US 7,528,953 B2
Frommer et al.  (45) Date of Patent: May 5, 2009

(54) TARGET ACQUISITION AND OVERLAY METROLOGY BASED ON TWO DIFFRACTED ORDERS IMAGING

(75) Inventors: Aviv Frommer, D.N. Misgav (IL); Vladimir Levinski, Nazareth Ilit (IL); Mark D. Smith, Austin, TX (US); Jeffrey Byers, Lexington, TX (US); Chris A. Mack, Austin, TX (US); Michael E. Adel, Zichron Ya'akov (IL)

(73) Assignee: KLA-Tencor Technologies Corp., Milpitas, CA (US)

( * ) Notice: Subject to any disclaimer, the term of this patent is extended or adjusted under 35 U.S.C. 154(b) by 203 days.

(21) Appl. No.: 11/363,755

(22) Filed: Feb. 27, 2006

(65) Prior Publication Data

US 2006/0197951 A1 Sep. 7, 2006

Related U.S. Application Data

(60) Provisional application No. 60/658,056, filed on Mar. 1, 2005, provisional application No. 60/725,918, filed on Oct. 11, 2005.

(51) Int. Cl.
*G01B 11/00* (2006.01)
*G06K 9/00* (2006.01)

(52) U.S. Cl. .................................. 356/401; 382/151
(58) Field of Classification Search ............... None
See application file for complete search history.

(56) References Cited

U.S. PATENT DOCUMENTS

| | | | |
|---|---|---|---|
| 4,828,392 A | 5/1989 | Nomura et al. | |
| RE34,010 E | 7/1992 | Magome et al. | |
| 5,327,221 A | 7/1994 | Saitoh et al. | |
| 5,347,356 A * | 9/1994 | Ota et al. | 356/490 |
| 5,477,309 A | 12/1995 | Ota et al. | |
| 6,023,338 A | 2/2000 | Bareket | |
| 6,937,337 B2 * | 8/2005 | Ausschnitt et al. | 356/401 |
| 7,349,105 B2 * | 3/2008 | Weiss | 356/620 |
| 2004/0066517 A1 * | 4/2004 | Huang et al. | 356/509 |
| 2005/0123844 A1 * | 6/2005 | Monshouwer | 430/22 |
| 2006/0033921 A1 * | 2/2006 | Den Boef et al. | 356/446 |

(Continued)

OTHER PUBLICATIONS

International Search Report from corresponding PCT Application No. PCT/US06/07195 dated Nov. 9, 2006.

*Primary Examiner*—Gregory J Toatley, Jr.
*Assistant Examiner*—Gordon J Stock, Jr.
(74) *Attorney, Agent, or Firm*—Weaver Austin Villeneuve & Sampson LLP

(57) ABSTRACT

In one embodiment, a system includes a beam generator for directing at least one incident beam having a wavelength λ towards a periodic target having structures with a specific pitch p. A plurality of output beams are scattered from the periodic target in response to the at least one incident beam. The system further includes an imaging lens system for passing only a first and a second output beam from the target. The imaging system is adapted such that the angular separation between the captured beams, λ, and the pitch are selected to cause the first and second output beams to form a sinusoidal image. The system also includes a sensor for imaging the sinusoidal image or images, and a controller for causing the beam generator to direct the at least one incident beam towards the periodic target or targets, and for analyzing the sinusoidal image or images.

30 Claims, 6 Drawing Sheets

U.S. PATENT DOCUMENTS

2006/0066855 A1* 3/2006 Boef et al. .................. 356/401
2007/0105029 A1* 5/2007 Ausschnitt ................... 430/30
2007/0176128 A1* 8/2007 Van Bilsen et al. .......... 250/548

* cited by examiner

Equation 2: $p = \dfrac{\lambda}{2 \sin \theta}$

TARGET ACQUISITION AND OVERLAY METROLOGY BASED ON TWO DIFFRACTED ORDERS IMAGING

RELATED APPLICATION DATA

The present application claims priority under 35 U.S.C. 119(e) to U.S. Provisional Patent Application No. 60/658, 056, filed Mar. 1, 2005, and U.S. Provisional Patent Application No. 60/725,918, filed Oct. 11, 2005, the entire disclosures of both which are incorporated herein by reference for all purposes.

BACKGROUND OF THE INVENTION

The present invention relates generally to metrology and inspection techniques, which are used in a semiconductor manufacturing processes. More specifically, the present invention relates to techniques for acquisition of wafer targets and measuring an alignment error between different layers or different patterns on the same layer of a semiconductor wafer stack.

Target acquisition is one of the most widespread processes during optical inspection and metrology of semiconductor. Every inspection or metrology recipe to test a semiconductor process requires accurate navigation to the target and identification and acquisition of the feature to be inspected. Presently, target acquisition is typically performed via special acquisition patterns that are printed together with layers of the wafer, next to the positions where the actual inspection or metrology operations are to be performed. The images of these acquisition patterns are captured via an imaging tool and an analysis algorithm is used to verify that the captured image contain the acquisition pattern, and calculate the target image coordinates on the true wafer.

The measurement of overlay and alignment error on a wafer is one of the most critical process control techniques used in the manufacturing of integrated circuits and devices. Overlay accuracy generally pertains to the determination of how accurately a first patterned layer aligns with respect to a second patterned layer disposed above or below it. Alignment error relates to the determination of how accurately a first pattern aligns with respect to a second pattern disposed on the same layer. The terms overlay and alignment are used herein interchangeably. Presently, overlay and alignment measurements are performed via test patterns that are printed together with layers of the wafer. The images of these test patterns are captured via an imaging tool and an analysis algorithm is used to calculate the relative displacement of the patterns from the captured images.

Conventionally, an object is imaged by an optical tool having a light source for directing incident beams towards the object. The beams are reflected and scattered away from the object towards an image sensor, such as a CCD (charge coupled device) camera. Specifically, there are multiple rays coming from the object. The rays then typically pass through a lens and thereafter form an image of the object at a specific plane, referred to as an image plane. The CCD camera then must be placed at this specific image plane location to achieve a focused image of the target with the least amount of blurring or with the most clarity.

Unfortunately, given conventional mechanical movement mechanisms, it is impossible to position the sensor at the absolute optimum focus position for every acquisition operation or overlay measurement. That is, conventional methods will have tolerances that do not allow movement to a precise enough position for achieving maximum focus for every acquisition operation or overlay measurement.

In addition optical aberrations of the imaging system cause a placement error of the image. For overlay targets, these placement errors are different for the scattered light from the first and second layer. The difference in the aberrations induced placement error causes an error in the overlay measurement. In order to minimize this aberration induced overlay error, accurate centering of the overlay target along the optical axis of the optical system is required.

Accordingly, improved target acquisition and overlay imaging mechanisms are needed. Additionally, a target imaging mechanism that provides flexible placement of the imaging sensor (z) would be beneficial. Additionally, an overlay metrology mechanism that provides flexible placement of the overlay target (x,y) would be beneficial.

SUMMARY OF THE INVENTION

Accordingly, improved mechanisms for determining target acquisition and for determining overlay or alignment error using optical imaging systems are disclosed. In general, the illumination of the system is only directed at specific angles at a grating target and the imaging lens is set to capture corresponding pairs of diffracted orders that interfere with each other to form a sinusoidal image. That is, everything captured by the imaging lens is used for imaging information. In one embodiment, there are two pairs of $0^{th}$ and $1^{st}$ diffraction orders that are coherent and will thereby interfere with each other and form a sinusoidal image. Since all of the output beams that are imaged in embodiments of the present invention contribute to the image, there is less DC background noise. Accordingly, contrast is improved over other types of conventional imaging systems. For overlay metrology applications, embodiments of the present invention provide higher accuracy as well as less sensitivity to optical aberrations and thus less tool induced shift, than conventional overlay determination techniques and apparatus.

These and other features and advantages of the present invention will be presented in more detail in the following specification of the invention and the accompanying figures which illustrate by way of example the principles of the invention.

BRIEF DESCRIPTION OF THE DRAWINGS

The present invention is illustrated by way of example, and not by way of limitation.

DETAILED DESCRIPTION OF THE INVENTION

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general, embodiments of the present invention provide mechanisms for target acquisition or for determining overlay (or alignment) by imaging with only two scattered beams from a periodic acquisition or overlay target such that the wavelength and the angle of separation between the two beams are substantially matched to the pitch of the target and cause a substantially pure sinusoidal image to be formed. The depth of focus of this sinusoidal image is very large. Accordingly, the position of the image sensor is flexible and does not have to be exactly placed at a single image focus plane location. That is, the sensor may be placed at a continuum of locations after the imaging lens and still reside in a well focused image plane. Although the following example embodiments are described as being applied to techniques for determining an overlay error between structures on different layers, these embodiments can be applied to techniques for determining alignment error between two structures on a same layer, or for target acquisition of structures on a same layer.

When two coherent plane waves interfere, the resulting intensity distribution has a spatial period given by Equation 1:

Equation 1:

$$p = \frac{\lambda}{\sin\theta_1 - \sin\theta_2}$$

where $\theta_1$ is the angular separation between the first wave and the normal to the image plane and $\theta_2$ is the angular separation between the second wave and the normal to the image plane, and $\lambda$ is the wavelength of the light. The resultant image of such two beam interference is a simple sinusoid with period (pitch) p.

Figure 1:
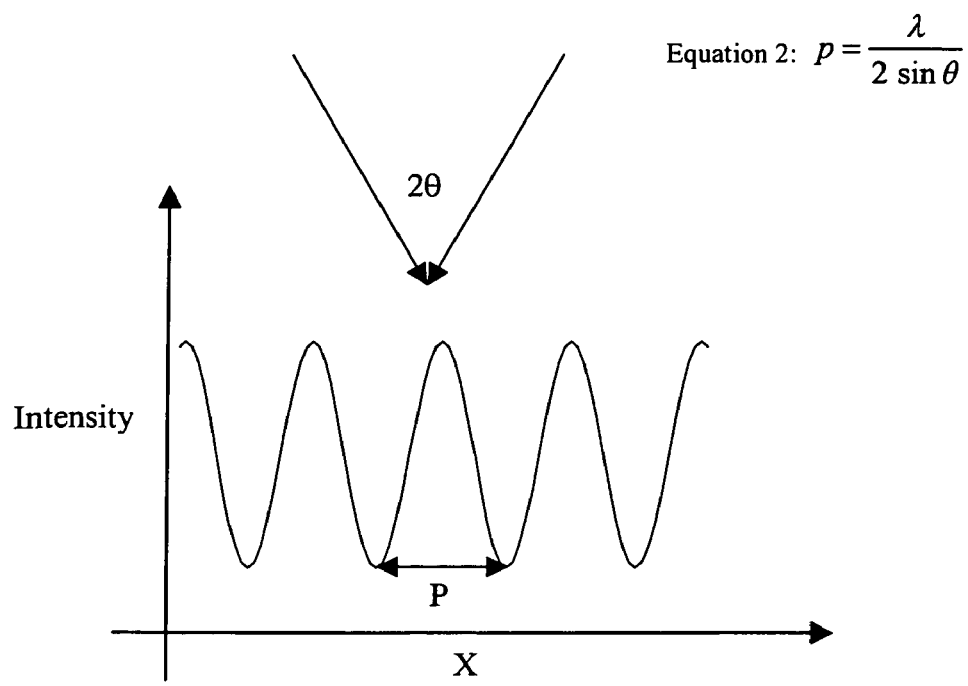
FIG. 1 illustrates the relationship between the resultant sinusoidal image formed from the interference between two monochromatic beams and the beams' angular separation and wavelength.
Figure 2:
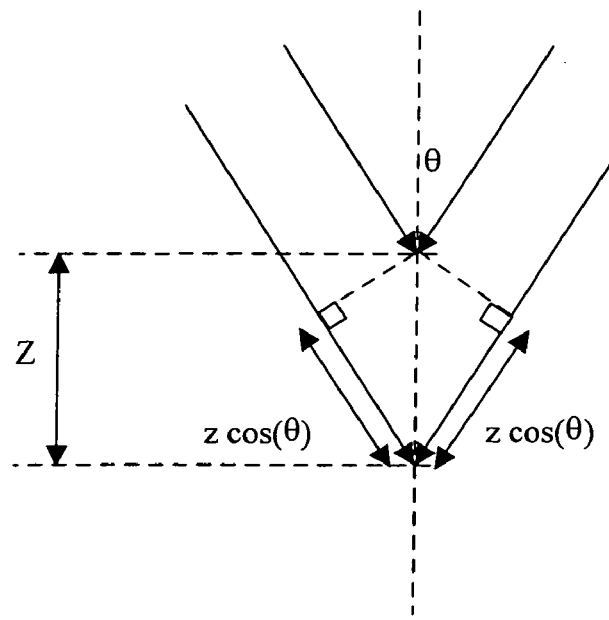
FIG. 2 illustrates the infinite depth of focus achieved with monochromatic two beam imaging.

When the two interfering coherent plane waves are symmetric about the normal to the image plane with each having an angular separation $|\theta|$ between the wave and the normal to the image plane, Equation 1 reduces to Equation 2:

Equation 2:

$$p = \frac{\lambda}{2\sin\theta}$$

where $2\theta$ is the angular separation between the waves, and $\lambda$ is the wavelength of the light. This relationship is illustrated in FIG. 1. When two rays interfere, the resulting image is sinusoidal. Additionally, an infinite depth of focus is achieved and, accordingly, the resulting sinusoidal image is formed across a continuum of image planes. As illustrated in FIG. 2, the relative phase between the image forming rays does not change with focus variation. Thus, in theory one does not have to focus on a particular depth or image plane, but can image at any depth from the object. As a result, the position of the sensor could be flexible and the sensor can be placed anywhere away from the object.

However, in practice the incident beams have both an angular and spectral spread when striking the target. A $\lambda$ including a narrow band of wavelengths that is less than 100 nm wide and a $\theta$ having an angular spread of less than 30 degrees can be achieved. In addition the periodic target is finite in size. Accordingly, although the depth of focus is not infinite, a very large depth of focus can be achieved by using two ray bundles with particular characteristics to image a target with specific characteristics. The large depth of focus defines a continuous range in which all planes can be used as image planes. This continuous range is termed the depth of focus of the system. It is a range (e.g. one micrometer) across which the image quality (focus) is good.

Any suitable mechanism may be utilized to create a sinusoidal image at a near infinite depth of focus. In one implementation, in order to form a sinusoid image, a periodic target is provided that is imaged with an off-axis incident plane wave, such that only two scattered plane waves are captured by the imaging lens. When a periodic target is imaged such that only two scattered plane waves are used to construct the image, the resulting sinusoidal image has the same period as the target's pitch.

Figure 3:
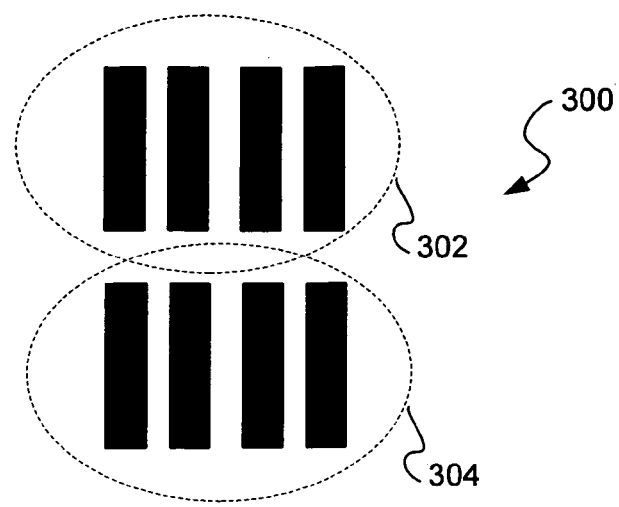
FIG. 3 is a top plan view of an example periodic overlay target in accordance with one embodiment of the present invention.

Any suitable periodic target may be utilized. FIG. 3 is a top plan view of an example periodic overlay target 300 having a first set of periodic line structures 302 in a first layer and a second set of periodic line structures 304 in a second layer in accordance with one embodiment of the present invention. Of course, this particular arrangement is merely illustrative and is not to limit the scope of the invention. For example, an array of other structures, such as squares, segmented lines, etc. may be utilized with the apparatus embodiments described herein.

The imaging optics are then arranged so that the target image is constructed by only two scattered plane waves so that the image will be sinusoidal and have the same pitch as the target. Two output beams are generated by any suitable mechanism so as to follow the requirements of Equations 1 or 2 described above. These two beams may be generated, by way of example, by two diffracted orders from a periodic target. Preferably, two output beams having a wavelength $\lambda$ are scattered with an angular separation of $2\theta$ from a single target with pitch p.

When overlay (or alignment) is determined, an absolute location of the target features is not needed. However, the relative displacement between an image of structures on a first layer and an image of structures on a second layer is important for overlay determination. When a ray at some angle to the normal θ and specific wavelength λ is incident on a periodic target with a pitch p selected according Equations 1 or 2, the output beams scattered from the target are in the form of multiple angles, defined as $0^{th}$ order diffraction, $-1^{st}$ order diffraction, $+1^{st}$ order diffraction, $-2^{nd}$ order, $+2^{nd}$ order, etc. These scattered output beams are called diffraction orders of the grating. The angles of the diffraction orders of the gratings depend on the pitch of the target and the wavelength and angle of the incident beams. Accordingly, in one implementation, the pitch of the target can be selected such that the $-1^{st}$ or the $+1^{st}$ order diffraction is reflected on the same path as the illuminating light.

In order to create two beam imaging using off axis illumination an effective source function $S(f_x, f_y) = \delta(f_x - \nu, \theta_y)$ is used, where $f_x$ and $f_y$ are the spatial frequencies variables and ν is the off-axis frequency. If ν is chosen such that:

$$\nu = \frac{1}{2p},$$

where p is the pitch of the target grating in x direction, the $0^{th}$ diffracted order propagates in the direction $$(f_x, f_y) = \left(-\frac{1}{2p}, 0\right),$$

and the $-1^{st}$ order travels in exactly the opposite direction $$(f_x, f_y) = \left(-\frac{1}{2p} + \frac{1}{p}, 0\right) = \left(\frac{1}{2p}, 0\right).$$

To ensure image symmetry with respect to focus for patterns with other periodicities the effective source can be balanced with respect to the origin, resulting in the dipole configuration:

$$S(f_x, f_y) = \frac{1}{2}\left[\delta\left(-\frac{1}{2p}, 0\right) + \delta\left(\frac{1}{2p}, 0\right)\right]$$

In order to image grating in both directions, the diagonal quadrupole configuration should be used:

$$S(f_x, f_y) = \frac{1}{4}\left[\delta\left(f_x \pm \frac{1}{2p_x}, f_y \pm \frac{1}{2p_y}\right)\right]$$

(The crossed quadrupole configuration $$-S(f_x, f_y) = \frac{1}{4}\left[\delta\left(f_x \pm \frac{1}{2p_x}, f_y\right) + \delta\left(f_x, f_y \pm \frac{1}{2p_y}\right)\right]$$

can also be used, it has a disadvantage in terms of total amount of light contributing to the image formation, and addition of a DC background light component, but may have some other advantages).

The imaging optics are also configured so that only the $-1^{st}$ or the $+1^{st}$ order (and the $0^{th}$ order) diffractions for each incident beam are captured by the imaging lens. The condition of "$1^{st}$ order diffraction" imaging (only the $0^{th}$ and either the $-1^{st}$ or the $+1^{st}$ order are captured by the imaging lens) with an effective source at $$\nu = \frac{1}{2p}$$

is achieved for pitch gratings for which

Equation 3:

$$\frac{1}{2p} = \frac{1}{p} = \frac{3}{2p} > \frac{NA}{\lambda} \text{ or } p < \frac{3}{2}\frac{\lambda}{NA}$$

In order to be resolved by the optics the pitch must also satisfy Equation 4:

Equation 4:

$$p > \frac{\lambda}{2NA}$$

Thus the following relationship between pitch, λ and NA for "$1^{st}$ order diffraction" imaging is given by Equation 5:

Equation 5:

$$\frac{\lambda}{2NA} < p < \frac{3}{2}\frac{\lambda}{NA}$$

Equation 5 is relevant for dipole illumination and for diagonal quadrupole illumination schemes.

In case of the crossed quadrupole illumination a more restrictive condition on p applies. For "$1^{st}$ order diffraction" we must guarantee that the Y axis poles $\pm 1^{st}$ diffraction orders from the X grating will not be collected by the lens thus p must satisfy Equation 6:

Equation 6:

$$\frac{\lambda}{2NA} < p < \frac{\lambda}{NA}$$

Figure 4:
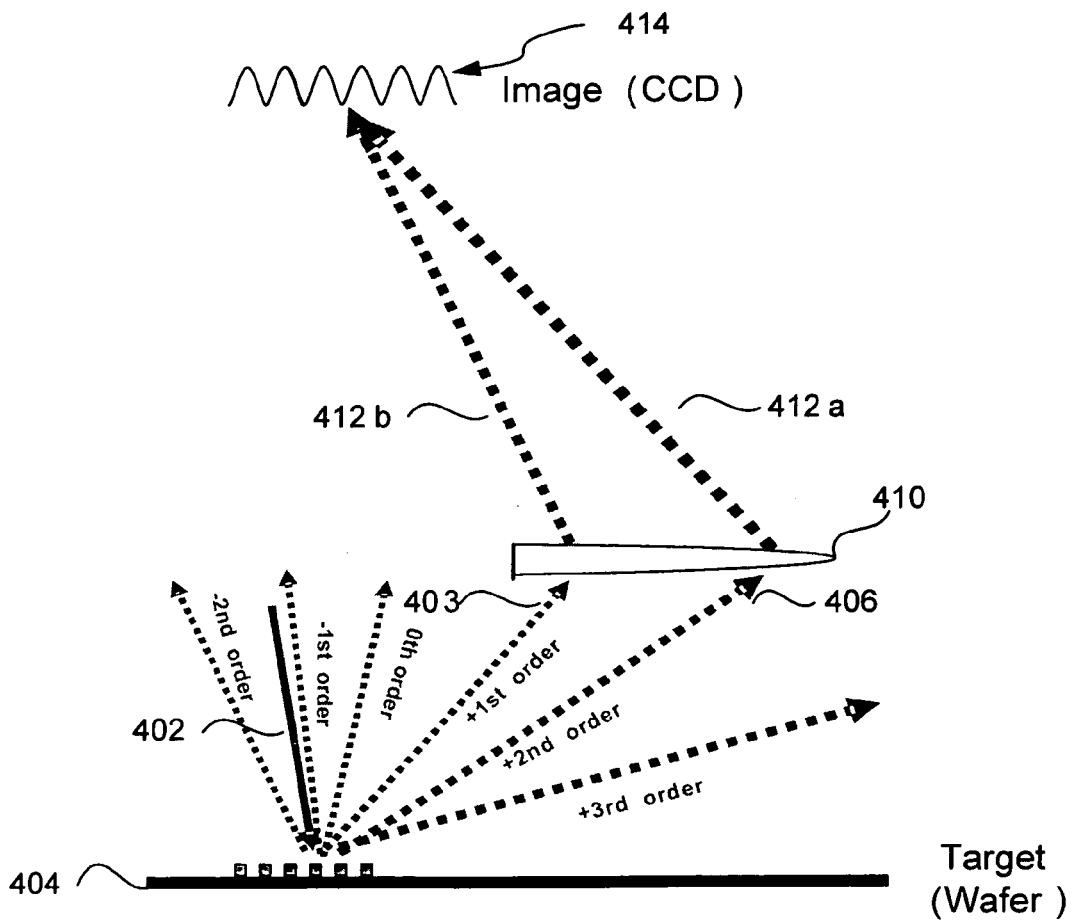
FIG. 4 is a schematic of a generalized $1^{st}$ order diffraction imaging system along the x axis, where only two diffracted orders are captured by the imaging lens, in accordance with a specific implementation of the present invention.

FIG. 4 is a schematic of a generalized $1^{st}$ order diffraction imaging system, where only two diffracted orders are captured, in accordance with one implementation of the present invention. As shown, an incident beam 402 is directed towards the grating target 404. Multiple diffracted orders are then scattered from the target 404.

The imaging system (shown here as lens 410) is configured to capture in this example only the $+1^{st}$ and $+2^{nd}$ diffracted orders. To accomplish this, the imaging lens is sized or the aperture stop is adjusted, and the lens is positioned so as to only capture these two diffracted orders. As shown, only a portion of lens 410 is shown, while the other portion that is not shown is blocked using an aperture stop.

The imaging lens may be arranged to capture any two diffraction orders. As illustrated in FIG. 4, the $+1^{st}$ and $+2^{nd}$ orders 403 and 406 pass through the imaging lens 410, while all other diffracted orders are prevented from passing through such imaging lens 410. In effect, two nearly plane waves 412a and 412b are output from the imaging lens 410. These output beams 412a and 412b form a sinusoidal image 414 across a very wide depth of focus. (Only the center plane of this focus range is illustrated for simplicity). A sensor (not shown) can then be placed at a larger range of positions to detect this sinusoidal image 414 with good focus being achieved across this sensor position range.

Figure 4A:
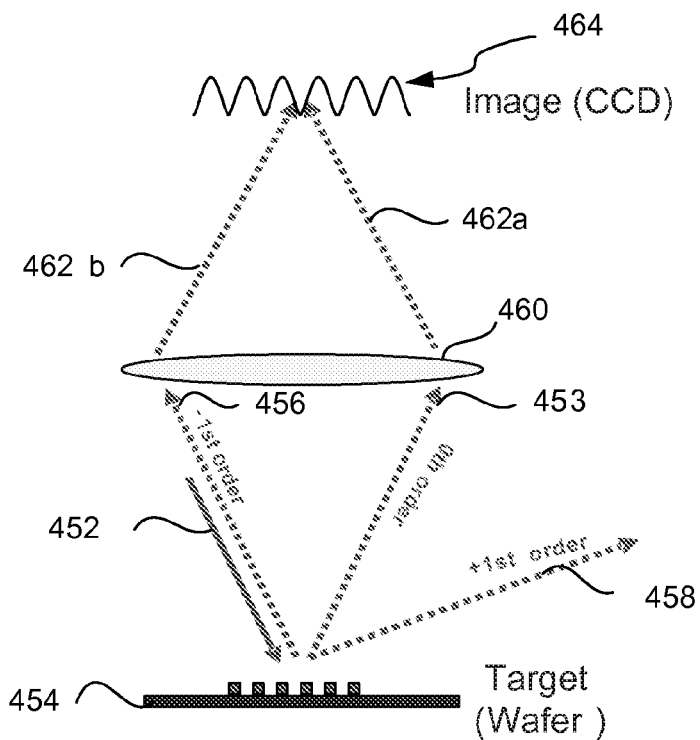
FIG. 4A is a schematic of a $1^{st}$ order diffraction imaging system along the x axis, where only the $0^{th}$ and the $-1^{st}$ diffracted orders are captured by the imaging lens, in accordance with another embodiment of the present invention.

FIG. 4A is a schematic of a $1^{st}$ order diffraction imaging system, where the two diffracted orders captured by the lens are the 0 and $-1^{st}$ diffracted orders, in accordance with another embodiment of the present invention. As shown, an incident beam 452 is directed towards the grating target 454. Multiple diffracted orders are then scattered from the target 454. As illustrated, $0^{th}$ diffracted order 453 is the specular reflection of incident beam 452. The $-1^{st}$ diffracted order 456 follows the same path as the incident beam 452, but in the opposite direction. Other orders are also scattered from the target 454. For example, the $+1^{st}$ diffracted order 458 is also scattered from the target. Other diffracted orders, such as $-2^{nd}$ and $+2^{nd}$ diffracted orders, may also be scattered from the periodic target 454, but are not shown so as to simplify the illustration.

The imaging system (shown here as lens 460) is configured (using the above Equations 2~5) to capture only the 0 and $-1^{st}$ diffracted orders. To accomplish this, the imaging lens is sized, or rather the numerical aperture (NA) is adjusted, so as to only capture two diffracted orders.

As illustrated in FIG. 4A, the $0^{th}$ and $-1^{st}$ orders 453 and 456 pass through the imaging lens 460, while other diffracted orders (e.g., the $+1^{st}$ diffracted order 458) are prevented from passing through such imaging lens 460. In effect, two nearly plane waves 462a and 462b are output from the imaging lens 460. These output beams 462a and 462b form a sinusoidal image 464 across a very wide depth of focus. (only the center plane of this focus range is illustrated for simplicity). A sensor (not shown) can then be placed at a larger range of positions to detect this sinusoidal image with good focus being achieved across this sensor position range.

Any suitable sensor may be used, such as a charge coupled detectors (CCD) or CMOS based digital camera, to detect the sinusoidal images from the imaged periodic targets.

Embodiments of the present invention provide several advantages. For example, this imaging system described herein can be used for the purpose of overlay metrology to image two adjacent periodic targets, a first periodic target on a first layer and a second periodic target on a second layer. If the first and second periodic targets have a same pitch (e.g., the first and second targets 302 and 304 of FIG. 3) and are illuminated with an incident beam such that the two diffracted orders captured by the lens have a well defined separation angle and wavelength such that the conditions of Equation 2 are met, both the first and second targets will be imaged by only the 0 and $-1^{st}$ diffracted order beams, which will sample the imaging lens at the same locations.

Thus, embodiments of the present invention cause the locations through which the diffracted $0^{th}$ and $1^{st}$ orders pass for both targets to be the same, defining the aberrations that the output beams see as they pass through the imaging system for both layers to be the same. Said in another way, the imaging lens will cause a same placement error for both the first layer target and the second layer target, bringing the tool induced shift (TIS) of an overlay measurement between the two layers to zero. In effect, the TIS that is the difference between the placement error of the first and the second layer targets is cancelled out. For instance, if the aberrations of the imaging optics shift the location of the sinusoid formed by the $0^{th}$ and $-1^{st}$ diffracted order output beams for the first layer by 2 nm to the right, these aberrations will likewise shift the sinusoid formed by the $0^{th}$ and $-1^{st}$ diffracted order output beams for the second layer by 2 nm to the right.

What this means is that placement error does not affect overlay determination since the relative displacement between the first and second layer targets is only important and not the absolute position of either of the two targets. Any misalignment between the two images from the first and second layer targets can be attributed to only the overlay error.

The overlay error may be determined in any suitable manner by analyzing whether and how much the images from the first and second layer targets are misaligned. In one implementation, the center of symmetry (COS) of the first layer image is determined, and the COS of the second layer image is determined. The difference between the first COS and the second COS can then be defined as the overlay error. Since the phase of the sinusoid image corresponds to the phase of the target, the phase of the sinusoid of the first layer structures can be compared to the phase of the sinusoid of the second layer structures. The phase difference can then be translated to spatial misalignment and defined as the overlay error.

In theory, a single incident beam may be used to produce two output beams, $0^{th}$ and $1^{st}$ diffraction order beams, that satisfy the conditions of the above Equations. For instance, as shown in FIG. 4A, the single incident beam 452 results in $0^{th}$ diffraction order output beam 453 and $-1^{st}$ diffraction order output beam 456. These two output beams would then pass through imaging lens 460 and result in two output beams 462a and 462b that interfere to form sinusoidal image 464.

Figure 4B:
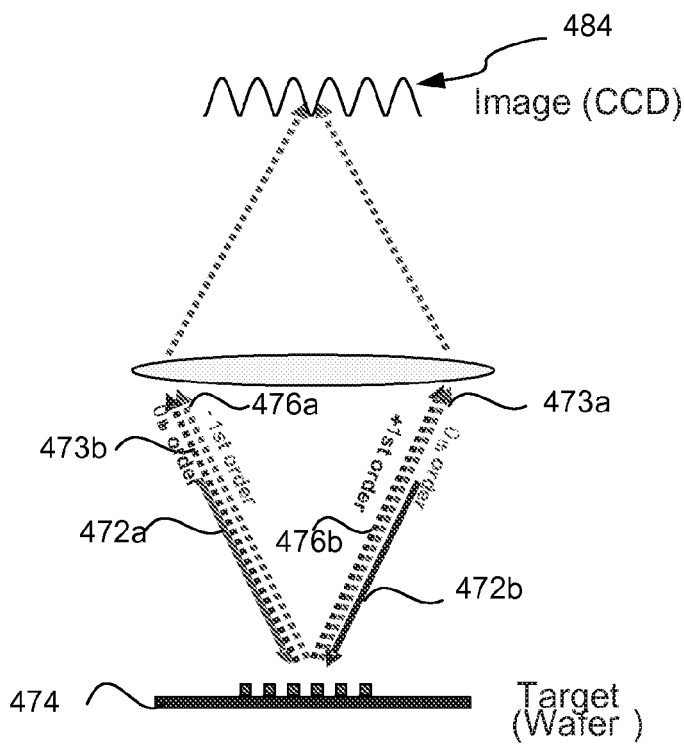
FIG. 4B is a schematic of a $1^{st}$ order diffraction imaging system along the x axis using dipole illumination, where only the $0^{th}$ and a $1^{st}$ diffracted order of both incident beams are captured by the imaging lens, in accordance with another embodiment of the present invention.

In another implementation, two incident beams are used to generate more light onto the target and a brighter image. FIG. 4B is a schematic of a $1^{st}$ order diffraction imaging system, where two incident beams are used. This configuration is called dipole illumination. As shown, two incident beams 472a and 472b are directed towards the target 474. Multiple diffracted orders are then scattered from the target 474. As illustrated, $0^{th}$ diffracted order 473a and 473b are specular reflections of incident beams 472a and 472b, respectively. Likewise, the $-1^{st}$ diffracted order 476a and the $+1^{st}$ diffracted order 476b follow the same paths as the 0 diffracted order beams 473b and 473a, respectively. Other diffracted orders are also scattered from the periodic target 474, but are not shown so as to simplify the illustration. The sinusoidal image 484 resulting from the $0^{th}$ and $-1^{st}$ diffracted orders from 473a and 476a adds up to reinforce the sinusoidal image 484 resulting from the $0^{th}$ and $+1^{st}$ diffracted orders 473b and 476b. The result is a brighter sinusoidal image 484.

Embodiments of the present invention will also result in better process robustness. For conventional imaging the image has been found to vary across the wafer, while measuring the same target at multiple sites across the wafer. The image variation is due to process variations across the wafer. Each site has slightly different characteristics, e.g., reflect at different spectral and angular intensity patterns. Periodic targets, however, will maintain diffractive orders at well defined angles for each wavelength and by allowing only two beam imaging a sinusoidal image will be formed with a pitch depending only on the pitch of the target, rather than the process.

For overlay metrology this will also result in a lower TIS variability. TIS variation is also due to process variations across the wafer. For $1^{st}$ order diffraction imaging TIS due to optical aberrations is eliminated and thus TIS variability will be reduced. Thus, TIS and overlay measurement, will be less sensitive to process variations.

Embodiments of the present invention will also result in higher contrast images. In the case of an isolated line that is imaged with a brightfield source, multiple diffraction orders are generated at multiple angles because the illumination is generated at multiple angles as well. In fact, multiple diffraction orders are generated for each of the different illumination angles. Some of the output rays will only have one strongly diffracted order captured by the imaging optics and this single order ray will not have a corresponding coherent peer with which to interfere to then contribute to image formation. Thus, this single order ray will only contribute to the general DC background. This effect reduces the contrast quality.

In embodiments of the present invention, the illumination is only directed at specific angles resulting in exactly corresponding pairs of diffracted orders that are captured by the imaging lens and interfere with each other to form a sinusoidal image. That is, everything captured by the imaging lens is used for imaging information. In the example of FIG. 4B, there are two pairs of $0^{th}$ and $1^{st}$ diffraction orders that are coherent and will thereby interfere with each other and form a sinusoidal image. Specifically, the $0^{th}$ diffraction order beam 473a and the $-1^{st}$ diffracted order beam 476a will form a first sinusoidal image, and the $0^{th}$ diffracted order beam 473b and the $+1^{st}$ diffracted order beam 476b will form a second sinusoidal image that overlaps with and reinforces the first sinusoidal image. Since all of the output beams that are imaged in embodiments of the present invention contribute to the image, there is less DC background noise. Accordingly, contrast is improved over other types of conventional imaging systems.

In the above described embodiments, there are two incident beams directed towards a target having periodic structures in a single direction, such as the x direction. This implementation is referred to as a dipole illumination system. Alternatively, a quadrapole illumination system may be implemented for imaging a target having periodic structures in both the y and x direction. Of course, a dipole system may be used for both x and y targets, where the x or y targets are imaged in a first direction using two beams and then the wafer is rotated with respect to the dipole illumination such that the other x or y targets are imaged in a second direction. In an alternative implementation, crossed quadrapole illumination may be used to contribute two beams in the x direction and two beams in the y direction. In another alternative implementation, diagonal quadrapole illumination may be used to contribute four beams each contributing in both the x and y directions, as opposed to contributing two incident beams to the x direction and two incident beams to the y direction. These different pole configurations are further mathematically described above.

Figure 5A:
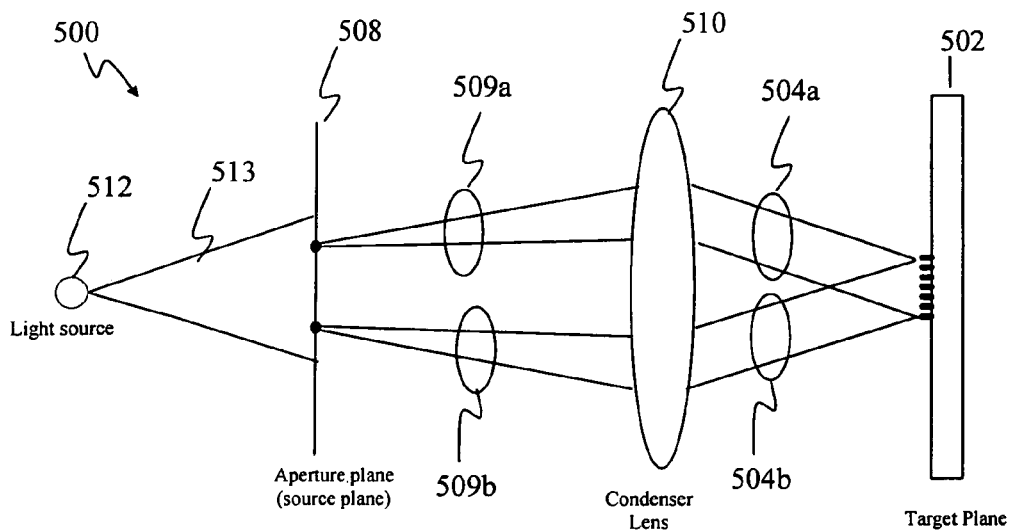
FIG. 5A is a diagrammatic side view representation of a dipole illumination system in accordance with one implementation.

FIG. 5A is a diagrammatic side view representation of a kohler illumination system employing dipole illumination system 500 in accordance with one implementation. As shown, the illumination system 500 includes a light source 512 that radiates light 513 at all angles. Any suitable number of light sources may be used. The light 513 from the light source is directed to aperture plane (aperture stop) 508. The aperture plane 508 includes one or more apertures to thereby form one or more point like sources radiating at all angles forming ray bundles, such as the two ray bundles 509a and 509b. Alternatively, two actual point like sources radiating at all angles such as Light Emitting Diodes (LEDs) could be located at the aperture plane 508 to form the two ray bundles 509a and 509b. These two ray bundles 509a and 509b then pass through condenser lens 510 which is configured to focus the two ray bundles 509a and 509b in the form of a first beam 504a and a second beam 504b that are directed towards periodic target 502 at specific angles.

Figure 5B:
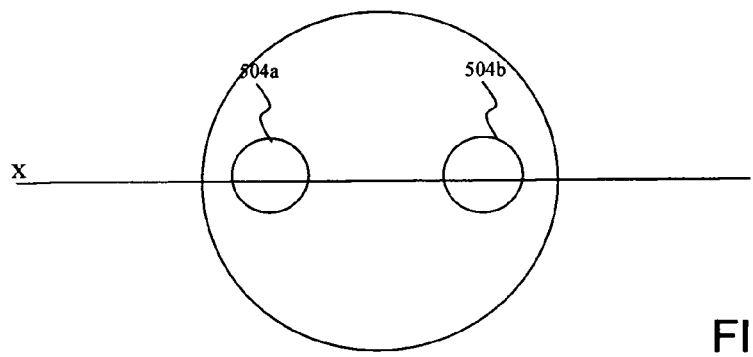
FIG. 5B is a top view of the aperture stop of FIG. 5A.

The first and second beams 504a and 504b have a $2\theta_x$ separation that is substantially matched to the pitch of target along the x axis $p_x$ and to the specific wavelength used. The two incident beams 504a and 504b are used to image a target in a single direction. For example, incident beams 504 are used to image x direction structures although they may alternatively be used to image y direction structures. FIG. 5B is a top view of the aperture stop 508 of system 500 with respect to the two incident beams 504a and 504b of FIG. 5A. As shown, the beams 504a and 504b emanate with respect to aperture stop 508 towards the target 502 in two directions.

Figure 5C:
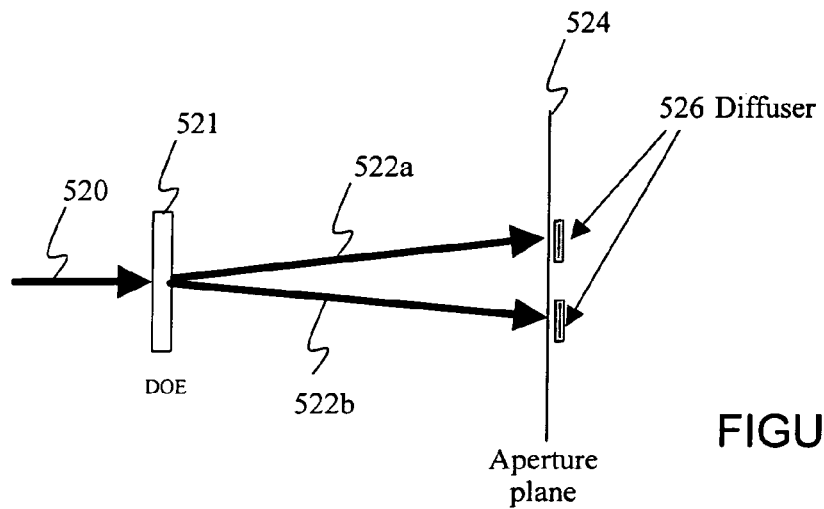
FIG. 5C is a diagrammatic representation of an alternative illumination system using a Diffractive Optical Element (DOE) to generate multiple sources at the aperture plane.

FIG. 5C is a diagrammatic representation of an alternative illumination system implementation. As shown, an incoming beam 520 is split into multiple beams (e.g., 522a and 522b) using a DOE (Diffractive Optical Element) 521, such that multiple beams hit the aperture plane 524 at the desired locations. Each beam 522a and 522b is than spread angularly using a diffuser 526 so that each beam radiates a ray bundle in all directions. These ray bundles then pass through condenser lens 510 which is configured to focus the two ray bundles to hit the target at a specific angle (not shown).

Figure 5D:
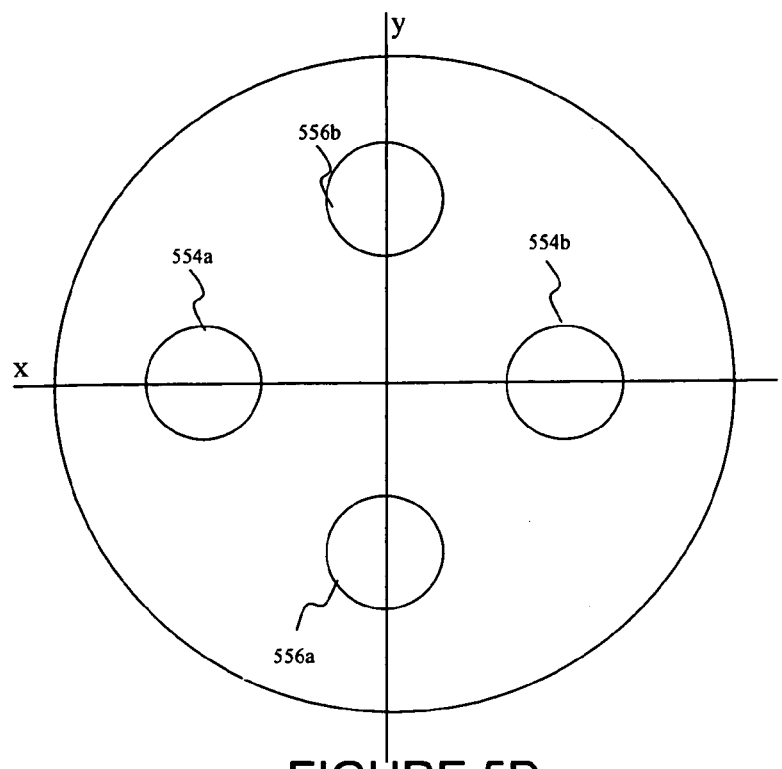
FIG. 5D is a top view of an aperture stop of a system for a cross quadrapole illumination configuration.

For targets having structures in both the x and y direction, a system may be configured to generate two beams for the x direction structures and two beams for the y direction structures. FIG. 5D is a top view of an aperture stop of a system for this crossed quadrapole configuration. As shown, a first beam originating from aperture 556a and a second beam originating from aperture 556b are directed towards a periodic target for imaging the target structures in a y direction. These y direction beams 556a and 556b have a $2\theta_y$ separation along the y axis matched to the pitch of target along the y axis, $p_y$, and to the specific wavelength used. Similarly, a first beam originating from aperture 554a and a second beam originating from aperture 554b are directed towards the same target for imaging target structures in the x direction. These beams 554a and 554b have a $2\theta_x$ separation along the x axis matched to the pitch of target along the x axis, $p_x$, and to the specific wavelength used.

Figure 5E:
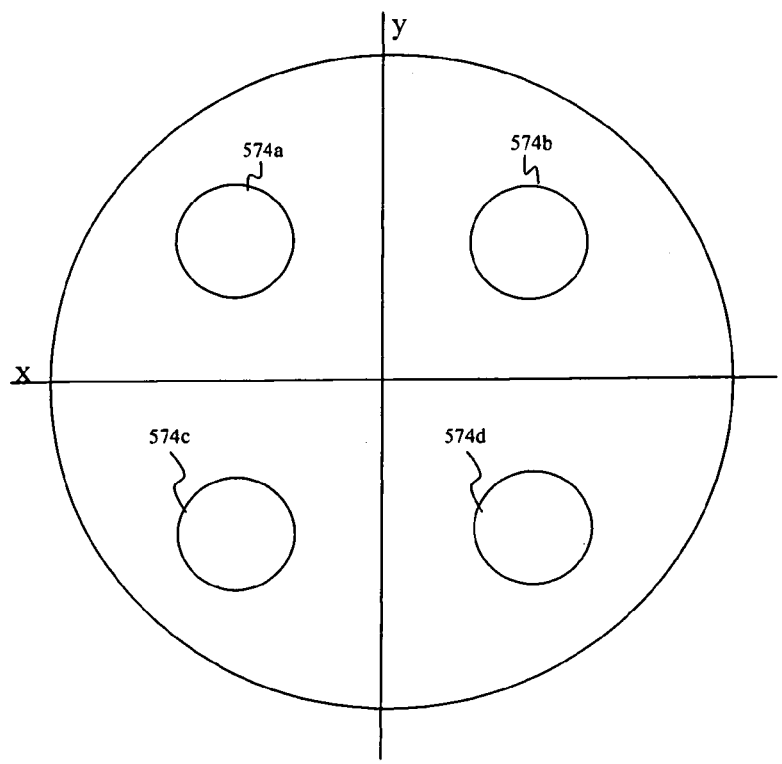
FIG. 5E is a top view of an aperture stop of a system for a diagonal quadrapole illumination configuration.

FIG. 5E is a top view of an aperture stop of a system for a diagonal quadrapole configuration. In this configuration all the beams originating from apertures 574a-574d contribute to image formation of both the x and y direction structures.

Figure 6:
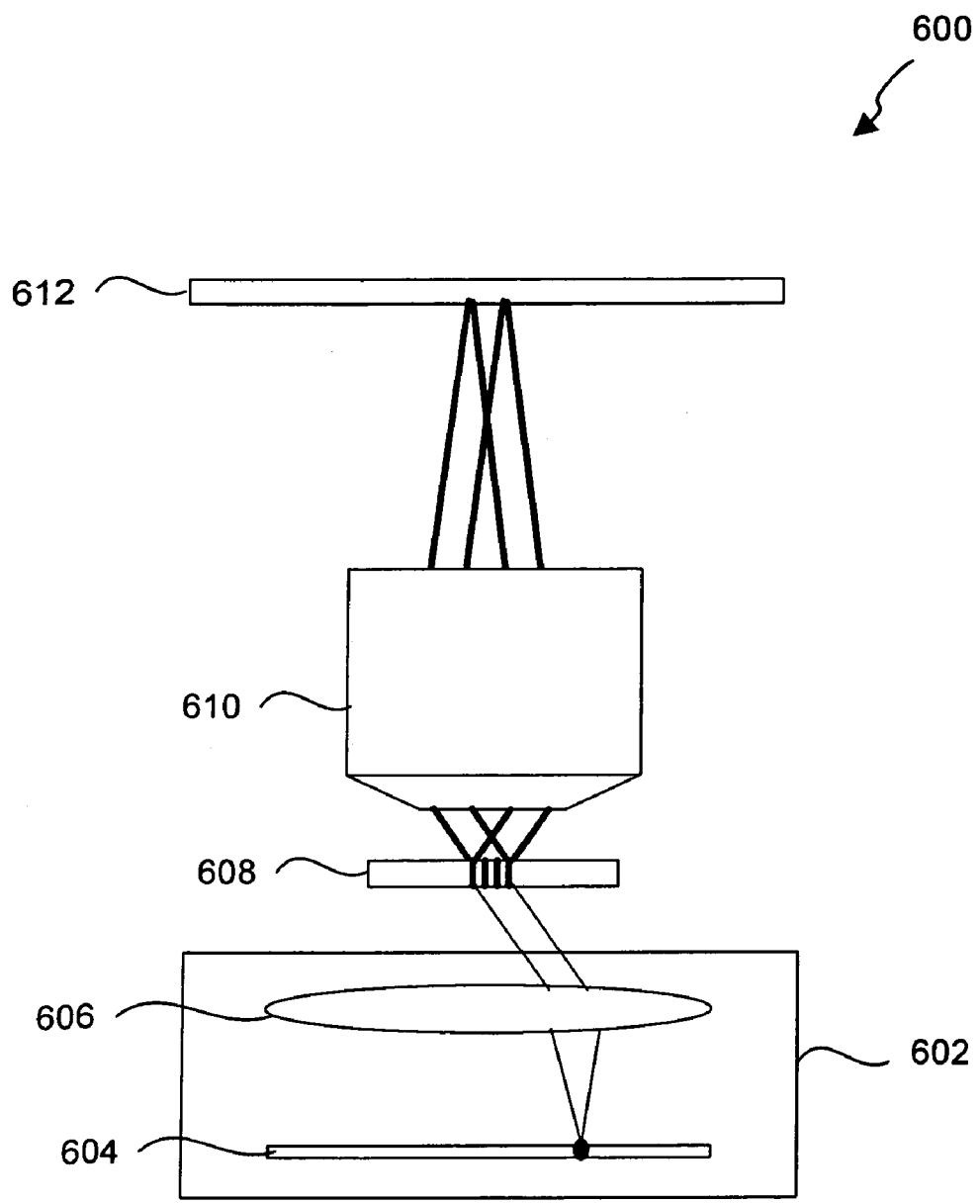
FIG. 6 is a diagrammatic representation of a $1^{st}$ order diffraction optical imaging system for target acquisition or for determining overlay or alignment in accordance with one embodiment of the present invention.

FIG. 6 is a diagrammatic representation of an optical imaging system for $1^{st}$ order diffraction imaging for target acquisition or for determining overlay or alignment in accordance with one embodiment of the present invention. For clarity, the illumination path is shown as if the system is a transmitted light system. In most embodiments the system is a reflected light system and the illumination path also passes through the objective lens from top to bottom. As shown, the system 600 includes a beam generator 602 for directing at least one beam towards a periodic target 608 having structures with a specific pitch p and an imaging lens 610 system for directing only a first and a second output beam from a target 608 as described above with respect to FIG. 4A, for example. The at least one incident beam has a wavelength value of $\lambda$ and an angle $\theta$ from an axis that is perpendicular to a plane of the target towards a periodic target. Angle $\theta$ and wavelength value $\lambda$ of the at least one incident beam and the pitch p of the periodic target are selected to substantially meet the requirement of Equation 2. The system further includes a sensor 612 for receiving the first and second output beams and generating an image based on the first and second output beams, wherein the image is sinusoidal. The system also includes a controller for (i) causing the beam generator to direct the at least one incident beam towards a periodic target or set of targets having a specific pitch p so that the sensor generates an image of the target or targets and (ii) analyzing the image. In the case of target acquisition applications, the image analysis includes determining whether the image is indeed the acquisition target. In the case of overlay metrology applications, the image analysis includes determining whether the first and second targets from a first and second layers have an overlay or alignment error.

In one embodiment of the present invention, the beam generator is realized using a light source 604 and a condenser lens 606. The light source may be implemented by any suitable device, such as a Diffractive Optical Element (DOE) for the generation of the at least one off axis illumination ray bundle directed at the condenser lens, or the generation of the at least one off axis illumination beam directed at the periodic target with pitch p. The advantage of realizing the illumination beam with a DOE is that a DOE can be designed to be spectrally "Self aligned" to the requirement of Equation 1 or 2. That is, a single DOE can be used to direct a spectrally broad incident beam onto the target having each wavelength being directed at a different incident angle θ such that Equations 1 or 2 is being met simultaneously for all wavelengths of the incident beam. A DOE can also be used to generate multiple illumination beams. A Diffractive beam-multiplication element may be used to split a beam into several beams, each with the characteristics of the original beam except for power and angle of propagation.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A system for imaging a plurality of targets in a semiconductor inspection or metrology tool, comprising:
    a beam generator for directing at least one incident beam having a wavelength λ towards a periodic target having structures with a specific pitch p, wherein a plurality of output beams are scattered from the periodic target in response to the at least one incident beam;
    an imaging lens system for passing only a first output beam and a second output beam from the target, wherein the imaging lens system is adapted such that an angular separation between the first and the second output beams, λ, and the pitch are selected to cause the first and second output beams to form a substantially pure sinusoidal image;
    a sensor for imaging the sinusoidal image; and
    a controller for causing the beam generator to direct the at least one incident beam towards a first and second periodic target, each having a specific pitch p, so that the sensor detects a first sinusoidal image of the first target and a second sinusoidal image of the second target and to analyze the first and second sinusoidal images to determine whether the first and second targets have an overlay error or an alignment error,
    wherein the first target is on a first layer and the second target is on a second layer, wherein the controller is arranged to determine an overlay error between the first and second targets by defining a misalignment between the first and second sinusoidal images as the overlay error.

2. A system as recited in claim 1, wherein angles of the two scattered beams captured by the imaging lens system with respect to a normal to a surface of the first and second periodic targets, $\theta_1$ and $\theta_2$, λ, and the pitch are selected to substantially meet a requirement $$p = \frac{\lambda}{\sin\theta_1 - \sin\theta_2}.$$

3. A system as recited in claim 1, wherein the angular separation between the two beams captured by the imaging lens system is 2θ and wherein 2θ, λ, and the pitch are selected to substantially meet a requirement $$p = \frac{\lambda}{2\sin\theta}.$$

4. A system as recited in claim 1, wherein λ includes a narrow band of wavelengths that is less than 100 nm wide and a θ has an angular spread of less than 30 degrees.

5. A system as recited in claim 1, wherein the incident beam is generated with use of a diffractive optical element designed to direct each wavelength at a different angle such that a requirement $$p = \frac{\lambda}{2\sin\theta}$$

is met simultaneously for a broad range of wavelengths, enabling use of broadband incident beams.

6. A system as recited in claim 1, wherein the first and second targets comprise a plurality of line structures.

7. A system as recited in claim 1, wherein optical aberration tool induced placement error (PE) affects the first and second sinusoidal images of the first target on a first layer and the second target on a second layer in a same way for both the first and second targets so that the overlay error or alignment error determination is not affected by optical aberrations.

8. A system as recited in claim 1, wherein the first output beam is coherent with the second output beam and include no output beams that only contribute to DC background noise.

9. A system as recited in claim 1, wherein the specific pitch, p, comprises $p_x$ for structures of the periodic target arranged in an x direction and $p_y$ for structures of the periodic target arranged in a y direction, and wherein the beam generator is adapted to direct a first incident beam and a second incident beam having an angular separation of $2\theta_x$ along the x direction selected to substantially meet a requirement $$p_x = \frac{\lambda}{2\sin\theta_x},$$

where
    λ is the wavelength, and a third and a fourth incident beam having an angular separation of $2\theta_y$ along the y direction selected to substantially meet a requirement $$p_y = \frac{\lambda}{2\sin\theta_y},$$

towards first and second periodic target in a crossed quadrupole arrangement.

10. A system as recited in claim 1, wherein the specific pitch, p, comprises $p_x$ for structures of the periodic target arranged in an x direction and $p_y$ for structures of the periodic target arranged in a y direction, and wherein the beam generator is adapted to direct a first incident beam, a second incident beam, a third incident beam, and a fourth incident beam arranged such that when projected on an x axis the incident beams have an angular separation of $2\theta x$ along the x direction selected to substantially meet a requirement $$p_x = \frac{\lambda}{2\sin\theta_x}$$

where $\lambda$ is the wavelength, and that when projected on a y axis the incident beams have an angular separation of $2\theta_y$ along the y direction selected to substantially meet a requirement $$p_y = \frac{\lambda}{2\sin\theta_y}$$

towards a periodic target in a diagonal quadrapole arrangement.

11. A system as recited in claim 1, wherein the first and second output beams include a coherent $0^{th}$ diffracted order and a coherent $1^{st}$ diffracted order and the imaging lens system is adapted to allow passage of only the $0^{th}$ and $1^{st}$ st diffracted orders.

12. A system as recited in claim 9, wherein the controller is further arranged to (i) cause the beam generator to direct the first and second incident beams towards the first and second periodic target so that the sensor detects a first sinusoidal image of the first target and a second sinusoidal image of the second target, (ii) analyze the first and second sinusoidal image to determine whether the first and second targets have an overlay or alignment error in the x direction, (iii) cause the beam generator to direct the third and fourth incident beams towards a third and fourth periodic target that have structure in the y direction so that the sensor detects a third sinusoidal image of the third target and a fourth sinusoidal image of the fourth target and (iv) analyze the third and fourth sinusoidal image to determine whether the third and fourth targets have an overlay or alignment error in the y direction.

13. A system as recited in claim 10, wherein the controller is further arranged to (i) cause the beam generator to direct the first and second incident beams towards the first and second periodic target so that the sensor detects a first sinusoidal image of the first target and a second sinusoidal image of the second target, (ii) analyze the first and second sinusoidal image to determine whether the first and second targets have an overlay or alignment error in the x direction, (iii) cause the beam generator to direct the third and fourth incident beams towards a third and fourth periodic target that have structure in the y direction so that the sensor detects a third sinusoidal image of the third target and a fourth sinusoidal image of the fourth target and (iv) analyze the third and fourth sinusoidal image to determine whether the third and fourth targets have an overlay or alignment error in the y direction.

14. A system as recited in claim 11, wherein the beam generator is adapted to direct a first and a second incident beam having an angular separation of $2\theta$ selected to substantially meet a requirement $$p = \frac{\lambda}{2\sin\theta},$$

where $\lambda$ is the wavelength and p is the periodic target pitch, towards the first and second targets in a dipole arrangement, wherein the first and second output beams each include the $1^{st}$ diffracted order and $0^{th}$ diffracted order.

15. A system as recited in claim 14, wherein p is selected so that the $1^{st}$ diffracted order and $0^{th}$ diffracted order share a same path.

16. A method for imaging an overlay or alignment semiconductor target, comprising:

directing at least one incident beam having a wavelength $\lambda$ towards a first and a second periodic target that each have structures with a specific pitch p, wherein a plurality of output beams are scattered from each of the first and second periodic target in response to the at least one incident beam;

passing only a first output beam and a second output beam from each of the first and second targets, wherein an imaging system is adapted such that an angular separation between the first and second output beams, $\lambda$, and the pitch are selected to cause the first and second output beams from the first and second targets to form a substantially pure first and second sinusoidal image, respectively;

sensing the first sinusoidal image of the first target and the second sinusoidal image of the second target; and analyzing the first and second sinusoidal images to determine whether the first and second targets have an overlay or alignment error, wherein the first target is on a first layer and the second target is on a second layer, wherein an overlay error between the first and second targets is determined by defining a misalignment between the first and second sinusoidal images as the overlay error.

17. A method as recited in claim 16, wherein the angular separation between the first and second output beams is $2\theta$ and wherein $2\theta$, $\lambda$, and the pitch, p, are selected to substantially meet a requirement $$p = \frac{\lambda}{2\sin\theta}.$$

18. A method as recited in claim 16, wherein $\lambda$ includes a narrow band of wavelengths that is less than 100 nm wide and a $\theta$ has an angular spread of less than 30 degrees.

19. A method as recited in claim 16, wherein the incident beam is generated with use of a diffractive optical element (DOE) either by setting the DOE before or after a condenser lens, designed to direct each wavelength at a different angle such that a requirement $$p = \frac{\lambda}{2\sin\theta}$$

is met simultaneously for a broad range of wavelengths, enabling use of broadband incident beams.

20. A method as recited in claim 16, wherein the first and second targets each comprise a plurality of line structures.

21. A method as recited in claim 16, wherein one or more tool optical aberrations affect the first and second sinusoidal images of the first target on a first layer and the second target on a second layer in a same way for both the first and second targets so that the overlay error or alignment error determination is not affected by the one or more optical aberrations.

22. A method as recited in claim 16, wherein the first output beam is coherent with the second output beam and include no output beams that only contribute to DC background noise.

23. A method as recited in claim 16, wherein the specific pitch, p, comprises $p_x$ for structures of the periodic targets arranged in an x direction and $p_y$ for structures of the periodic targets arranged in a y direction, and the method further comprising:

directing a first and a second incident beam having an angular separation $2\theta_x$ along the x direction and selected to substantially meet a requirement $$p_x = \frac{\lambda}{2\sin\theta_x},$$

where λ is the wavelength; and directing a third and a fourth incident beam having an angular separation of $2\theta_y$ along the y direction selected to substantially meet a requirement $$p_y = \frac{\lambda}{2\sin\theta_y}$$

towards a periodic target in a crossed quadrupole arrangement.

24. A method as recited in claim 16, wherein the specific pitch, p, comprises $p_x$ for structures of the periodic targets arranged in an x direction and $p_y$ for structures of the periodic targets arranged in a y direction, and the method further comprising:

directing first, second, third, and fourth incident beams arranged such that when projected on an x axis the incident beams have an angular separation $2\theta_x$ along the x direction selected to substantially meet a requirement $$p_x = \frac{\lambda}{2\sin\theta_x},$$

where

λ is the wavelength, and that when projected on a y axis the incident beams have an angular separation of $2\theta_y$ along the y direction selected to substantially meet a requirement $$p_y = \frac{\lambda}{2\sin\theta_y}$$

towards a periodic target in a diagonal quadrapole arrangement.

25. A method as recited in claim 16, wherein the first and second output beams include a coherent $0^{th}$ diffracted order and a coherent $1^{st}$ diffracted order and the imaging system is adapted to allow passage of only the $0^{th}$ and $1^{st}$ diffracted orders.

26. A method as recited in claim 23, further comprising:
directing the first and second incident beams towards the first and second periodic target so that a detector detects a first sinusoidal image of the first target and a second sinusoidal image of the second target;
analyzing the first and second sinusoidal image to determine whether the first and second targets have an overlay or alignment error in the x direction;
directing the third and fourth incident beams towards a third and fourth periodic target that have structure in a y direction so that the detector detects a third sinusoidal image of the third target and a fourth sinusoidal image of the fourth target; and
analyzing the third and fourth sinusoidal image to determine whether the third and fourth targets have an overlay or alignment error in the y direction.

27. A method as recited in claim 24, further comprising:
directing the first, second, third and fourth incident beams towards the first target, the second target, a third target, and a fourth targets so that a detector detects a first sinusoidal image of the first target, a second sinusoidal image of the second target, a third sinusoidal image of third target, and a fourth sinusoidal image of the fourth target;
analyzing the first and second sinusoidal images to determine whether the first and second targets have an overlay or alignment error in the x direction;
analyzing the third and fourth sinusoidal images to determine whether the third and fourth targets have an overlay or alignment error in the y direction.

28. A method as recited in claim 25, further comprising directing a first and a second incident beam having an angular separation of 2θ selected to substantially meet a requirement $$p = \frac{\lambda}{2\sin\theta},$$

where
λ is the wavelength and p is the periodic target pitch,
towards the first and second targets in a dipole arrangement, wherein the first and second output beams each include the $1^{st}$ diffracted order and $0^{th}$ diffracted order.

29. A method as recited in claim 28, wherein p is selected so that the $1^{st}$ diffracted order and $0^{th}$ diffracted order share a same path.

30. A system for imaging a semiconductor acquisition target in a semiconductor inspection or metrology tool, comprising:
a beam generator for directing at least one incident beam having a wavelength λ towards a periodic target having structures with a specific pitch p, wherein a plurality of output beams are scattered from the periodic target in response to the at least one incident beam;

an imaging lens system for passing only a first and a second output beam from the target, wherein the imaging system is adapted such that an angular separation between the first and the second output beams, $\lambda$, and the pitch are selected to cause the first and second output beams to form a substantially pure sinusoidal image across a plurality of continuous image planes;

a sensor for imaging the sinusoidal image; and a controller for causing the beam generator to direct the at least one incident beam towards a target having specific pitch p so that the sensor detects a sinusoidal image and to determine if target acquisition was successful by comparing the pitch of the target design to the pitch of the detected sinusoidal image.

* * * * *